(12) United States Patent
Yoshimura et al.

(10) Patent No.: US 6,494,197 B1
(45) Date of Patent: Dec. 17, 2002

(54) DICING MACHINE FOR CUTTING CSP PLATE INTO PELLETS

(75) Inventors: Eiichi Yoshimura; Ken Togashi; Shinichi Namioka, all of Tokyo (JP)

(73) Assignee: Disco Corporation, Tokyo (JP)

( * ) Notice: Subject to any disclaimer, the term of this patent is extended or adjusted under 35 U.S.C. 154(b) by 64 days.

(21) Appl. No.: 09/650,857

(22) Filed: Aug. 29, 2000

(30) Foreign Application Priority Data

Sep. 6, 1999 (JP) .......................................... 11-251635

(51) Int. Cl.[7] ................................................. B28D 1/02
(52) U.S. Cl. ......................... 125/12; 125/23.01; 125/35; 451/339
(58) Field of Search ........................... 125/1, 12, 23.01, 125/35; 451/67, 339; 83/168

(56) References Cited

U.S. PATENT DOCUMENTS 5,174,067 A * 12/1992 Hasegawa et al. .......... 414/217
5,842,461 A * 12/1998 Azuma ..................... 125/13.01
6,102,023 A * 8/2000 Ishiwata et al. ......... 125/13.01
6,257,966 B1 * 7/2001 Ishikawa et al. ............ 451/279
6,296,555 B1 * 10/2001 Inaba et al. ................. 451/282

* cited by examiner

Primary Examiner—Timothy V. Eley
(74) Attorney, Agent, or Firm—Rader, Fishman & Grauer, PLLC

(57) ABSTRACT

Disclosed is a dicing machine for cutting a CSP plate into pellets and for transferring and putting them in a transport tray. The pick-up-and-transport means picks a selected pellet from a diced CSP plate to carry and put the so selected pellet in an allotted cell in a transport tray. On the way to the transport tray storage area, there is cleaning means for wiping and removing minute pieces of debris if any from the rear side of each pellet. The cleaning means includes a wiper in the form of rotary sponge roll, which is wet with washing liquid, and is rotated to expose its clean surface to each pellet all the time.

7 Claims, 9 Drawing Sheets

FIG. 7A

Contents of the First Memory Means

| Identification Number of CSP Plate | Identification Number of CSP Plate | Identification Number of CSP Plate | Identification Number of CSP Plate |
|---|---|---|---|
| 001 | | | |

FIG. 7B

Contents of the Second Memory Means

| Identification Number of CSP Plate | Identification Letters and the Number of Identification Holes of Jig Holders | Addresses of Jig Holders | Pellet Sizes and Other Particulars |
|---|---|---|---|
| 001 | A, 3 | 1-1<br>1-2<br>1-3<br>1-4 | 10 mm square<br>4 (lateral divisions)<br>8 (longitudinal divisions) |
| 002 | B, 2 | 2-1<br>2-2<br>2-3<br>2-4 | 5 mm square<br>6 (lateral divisions)<br>14 (longitudinal divisions) |
| 003 | C, 1 | 3-1<br>3-2<br>3-3<br>3-4 | |
| 004 | D, 0 | 4-1<br>4-2<br>4-3<br>4-4 | |

FIG. 7C

Contents of the Third Memory Means

| Results of Detection |
|---|

FIG. 12
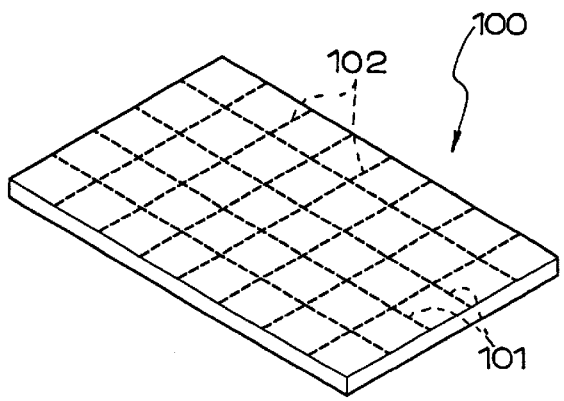
FIG. 13
PRIOR ART
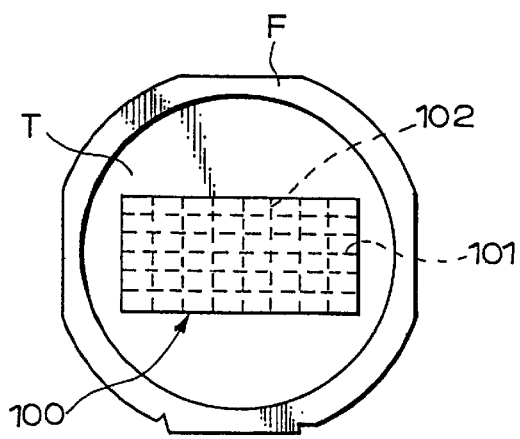
FIG. 14
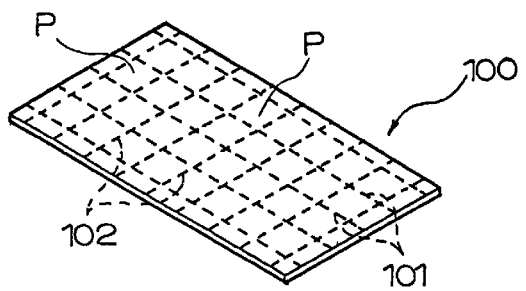
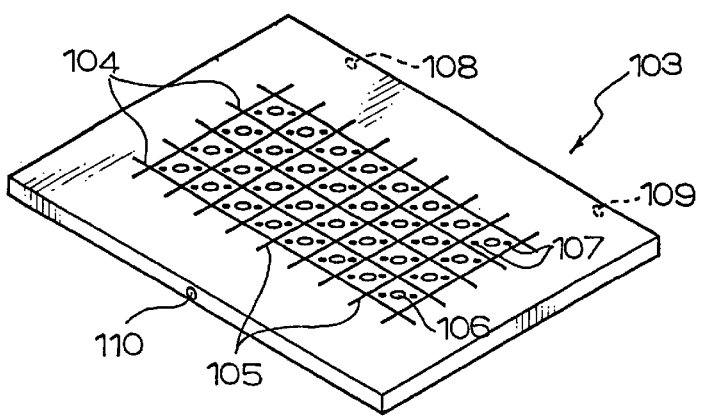

DICING MACHINE FOR CUTTING CSP PLATE INTO PELLETS

BACKGROUND OF THE INVENTION

1. Field of the Invention

The present invention relates to a dicing machine for cutting a CSP plate into pellets and transferring and putting them in a transport tray.

2. Related Arts

Referring to FIG. 12, a chip size package (abbreviated as "CSP") plate 100 has a plurality of semiconductor chips hermetically packaged with glass, epoxy resin or such like, and it can be cut crosswise along the crossing lines 101 and 102 into separate pellets or CSPs. The so separated pellets are put in a transport tray to be shipped or transported to a selected assembling line in the electronic device manufacturing factory.

Referring to FIG. 13, a CSP plate 100 is attached to a holder frame F with an adhesive tape T, and the CSP plate-and-holder frame is brought to the dicing station in which the CSP plate is cut into squares. Such adhesive tapes are thrown away after being used. Lots of such disposable tapes when thrown away will cause significant contamination in the surroundings, and the throwing-away of such disposable tapes is disadvantageous from the economical point of view. Referring to FIG. 14, a reusable jig holder 103 may be used to hold a CSP plate 100 thereon in place of such a disposable tape. The CSP plate 100 can be fixedly held on the reusable jig holder 103 by applying negative pressure to its longitudinal opposite sides as later described. Likewise, the jig holder 103, in its turn, is sucked on the working table of dicing machine to cut the overlying CSP plate while being washed with water to remove pieces of debris from the diced CSP plate.

As seen from FIG. 14, the jig holder 103 has crosswise grooves 104 and 105 made in alignment with the crosswise cutting lines 101 and 102 of the CSP plate 100. These grooves 104 and 105 allows the cutter blade to enter freely after cutting the overlying CSP plate. Each square section defined by the crosswise grooves 104 and 105 has a single first suction hole 106 at its center and two second suction holes 107 on its diagonal line. Each first suction hole 106 passes through the full thickness of the plate from its front to back surface whereas each second suction hole 107 communicates with the engagement holes 108, 109 and 110, which are made in the opposite longitudinal sides of the plate 100 for applying negative pressure to the overlying CSP plate while being transported. The overlying CSP plate 100 is fixedly held to the jig holder 103 by applying negative pressure through the first suction holes 106 from the working table while being diced.

While the CSP plate 100 is being cut, minute pieces of debris are mixed in the washing water, and then the contaminated water is drawn through the crosswise grooves. The contaminated water is apt to invade into the space between the rear side of each pellet P and the underlying jig frame 103 to leave some minute pieces of debris there, thus allowing some pellets to be contaminated with such minute pieces of debris.

After washing the diced CSP plate, all minute pieces of debris can be washed away from the top surface of each pellet P, but the minute pieces of debris cannot be removed from the rear side of the pellet P.

As a result, contaminated pellets can be transported to the assembling line in the factory. The same problem will be caused in case of diced CSP plate attached to their frames with adhesive tapes T (FIG. 13); contaminated water is allowed to invade into the pellet-to-frame gap through the cutting slots. There has been, therefore, an increasing demand for removing minute pieces of debris from the rear side of each and every pellet before putting it in the transport tray.

SUMMARY OF THE INVENTION

One object of the present invention is to provide a dicing machine which is capable of removing minute pieces of debris from the rear side of each and every pellet before putting in a transport tray.

To attain this object, a dicing machine for cutting a CSP plate into pellets to put them in a transport tray including a CSP plate bearing table on which a diced CSP plate is to be laid, a transport tray station in which a transport tray is laid to receive individual pellets, and pick up-and-transport means for picking a selected pellet from a diced CSP plate and for putting the so selected pellet in an allotted place in the transport tray, is so designed according to the present invention that it further includes cleaning means for wiping and removing minute pieces of debris if any from the rear side of each pellet on the way from the CSP table bearing table to the transport tray station.

The pick up-and-transport means may comprise movable pellet-suction means for carrying a selected pellet and an elongated guide for guiding the movable pellet-suction means while it travels on the way from the CSP plate bearing table to the transport tray station, thereby allowing the cleaning means to wipe and remove minute pieces of debris if any from the rear side of each pellet.

The cleaning means may comprise a wiper for removing minute pieces of debris if any from the rear side of each pellet, washing liquid supply means for supplying the wiper with the washing liquid, and a drain for draining used washing liquid.

The wiper may comprise a rotary sponge roll, which has the washing liquid supply means fitted in the center of the sponge roll.

Minute pieces of debris can be removed from the rear side of each and every pellet while being transported to the transport tray station, and therefore no extra time is required for cleaning.

Other objects and advantages of the present invention will be understood from the following description of a dicing machine according to one preferred embodiment of the present invention, which is shown in accompanying drawings.

BRIEF DESCRIPTION OF THE DRAWING

FIGS. 7A, 7B and 7C show the contents of first, second and third storage means of the decision-making system;

FIG. 12 is a perspective view of one example of CSP plate;

FIG. 13 is a CSP plate-and-frame combination, the CSP plate being attached to the frame with an adhesive tape; and FIG. 14 illustrates a CSP plate and an associated jig holder for the CSP plate.

DETAILED DESCRIPTION OF PREFERRED EMBODIMENT

Figure 1:
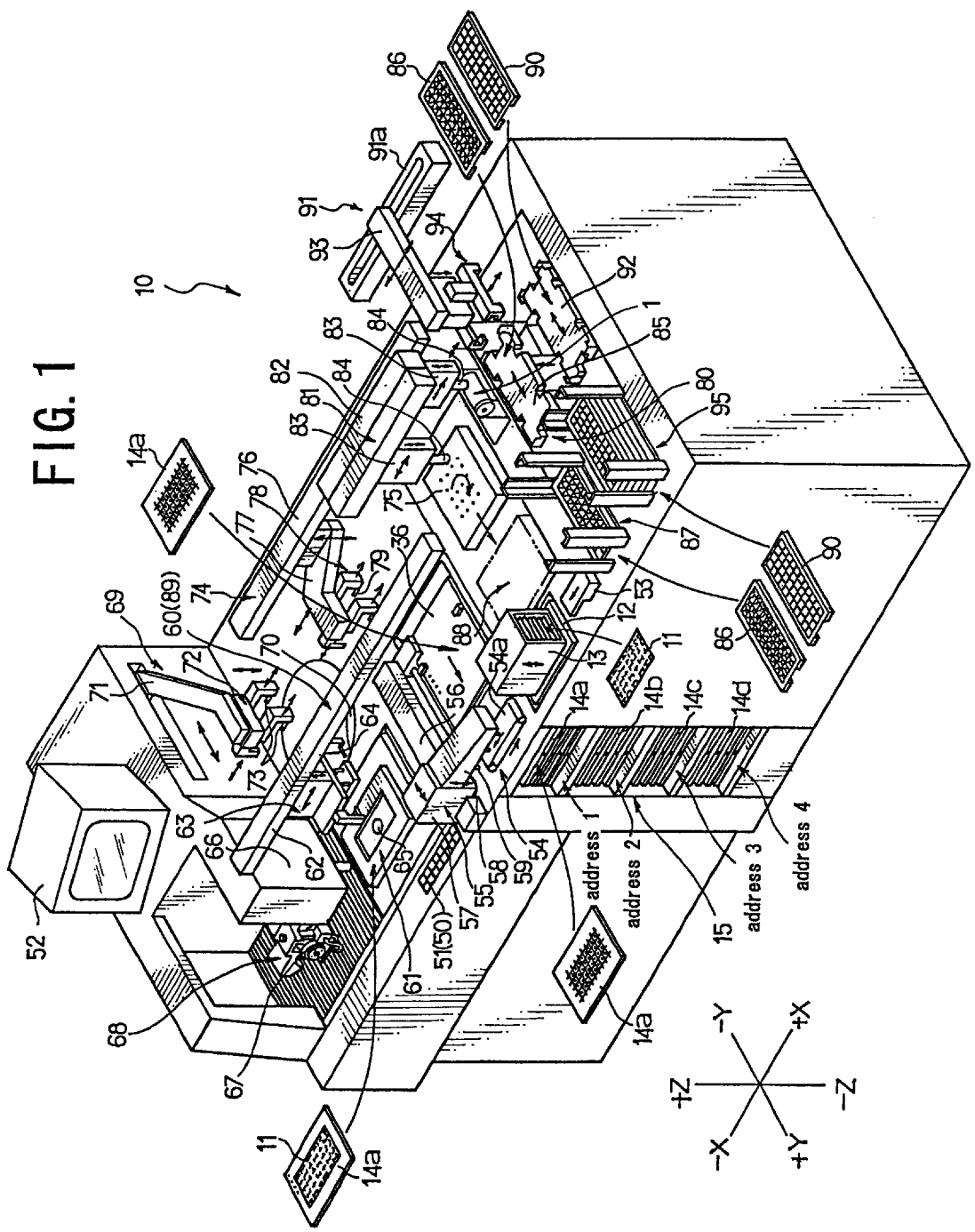
FIG. 1 is a perspective view of a dicing machine according to the present invention.

Referring to FIG. 1, a dicing machine 10 is used in cutting a CSP plate into pellets to put them in a transport tray. A pile of CSP plates 11 is contained in a cassette 13, which is put on a rising-and-descending table 12. Likewise, piles of jig holders of two or more different types are contained in a rack 15. These different jig holders are selectively used in holding CSP plates of different types. In FIG. 1, four jig holders each of four different types 14a, 14b, 14c and 14d are put on the shelves given addresses Nos. 1, 2, 3 and 4 respectively.

Figure 2:
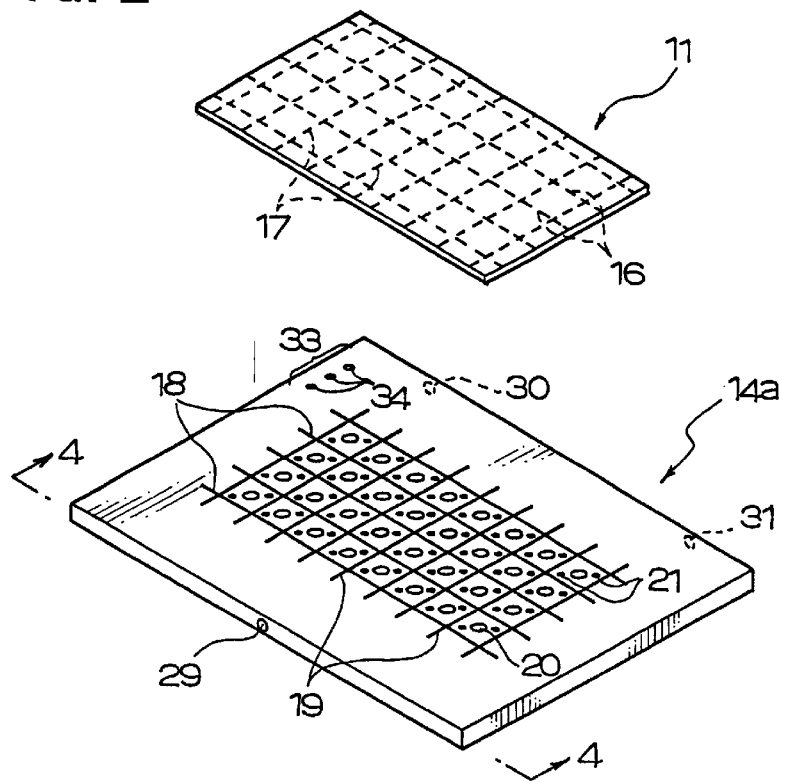
FIG. 2 illustrates a CSP plate and a jig holder for the CSP plate.
Figure 3:
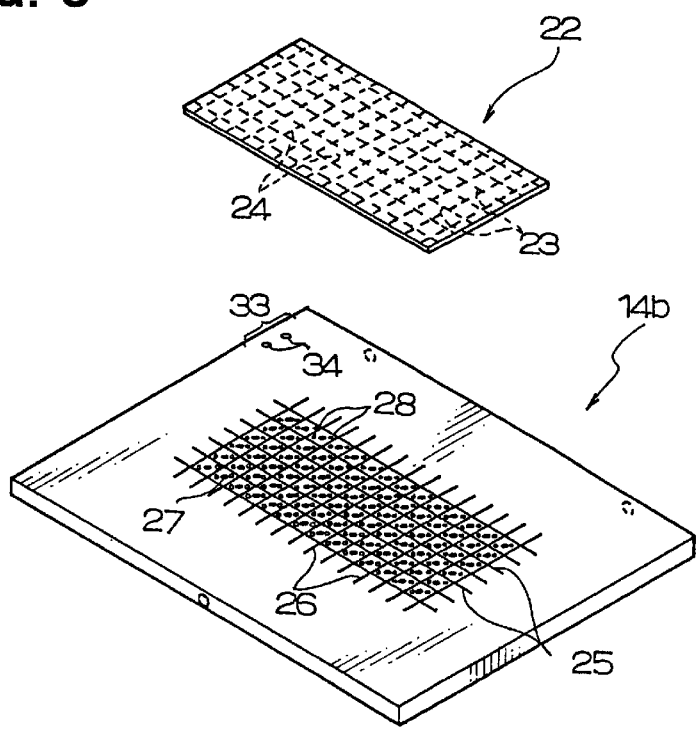
FIG. 3 illustrates a CSP plate and another jig holder for the CSP plate.

Referring to FIG. 2, a CSP plate 11 is a flat plate having crosswise cutting lines 16 and 17 to separate individual CSPs. A jig holder 14a is so constructed that it may support the overlying CSP plate 11 on its rear side, and that all CSPs or pellets when separated from each other may be fixedly held on the jig holder 14a. Specifically, each divisional section defined by crosswise grooves 18 and 19 made in alignment with the crosswise cutting lines 16 and 17 of the CSP plate has a single first suction hole 20 and two second suction holes 21 made therein. Another CSP plate 22 as shown in FIG. 3 has an increased number of crosswise cutting lines 23 and 24, and accordingly the associated jig holder 14b has a corresponding increased number of crosswise grooves 25 and 26 made therein. Accordingly the numbers of first and second suction holes 27 and 28 are larger than those of first and second suction holes 20 and 21 in FIG. 2.

Referring to FIG. 2 again, the jig holder 14a has three engagement holes 29, 30 and 31 made on its opposite longitudinal sides. The first suction pipe 64 of the first transport means 60, the second suction pipe 73 of the second transport means 69 and the third suction pipe 79 of the third transport means 74 (later described in detail) can be inserted in these engagement holes 29, 30 and 31 respectively.

Figure 4:
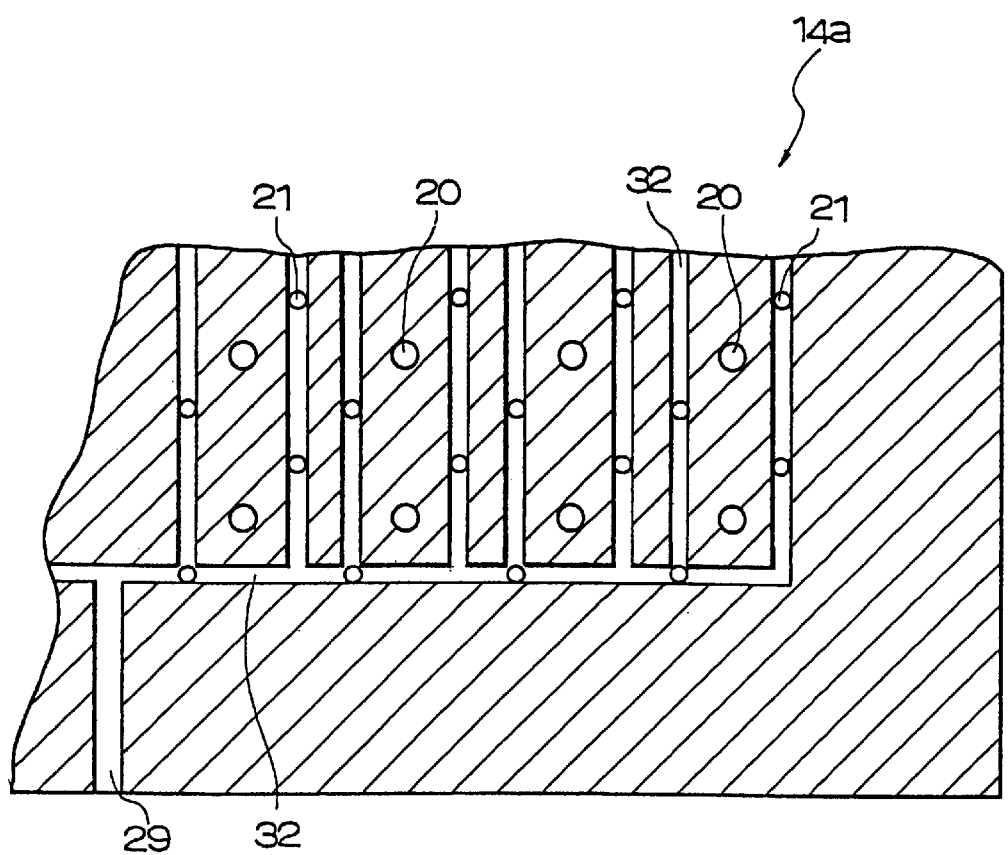
FIG. 4 is a sectional view of the jig holder taken along the line 4—4 in FIG. 2.

Referring to FIG. 4, each of the first suction holes 20 passes through the thickness of the jig holder 14a whereas all second suction holes 21 communicate with the three engagement holes 29, 30 and 31 via the duct passages 32, which are made in the thickness of the jig holder 14a.

Each jig holder 14a has an identification mark 33 formed on its upper surface. The identification mark 33 is, for example, a series of holes. The jig holder 14a can be identified in terms of the number of holes (for example, three holes 34 in this particular example). As shown in FIG. 3, the jig holder 14b has two holes for identification. Bar codes may be used in place of identification holes.

Referring to FIGS. 5A to 5D, the jig holder taking out-and-in unit 35 comprises an upright wall 37 having an "L"-shaped stage 39 vertically movable thereon, and a jig holder putting in-and-taking out table 36 horizontally movable on the cantilever-like extension of the "L"-shaped stage 39. The upright wall 37 has a vertical slot 40 and two parallel vertical rails 38 laid on the opposite sides of the vertical slot 40. The "L"-shaped stage 39 has a rear projection formed on its dependent extension. The rear projection has a tapped hole made thereon, and the rear projection is slidably fitted in the vertical slot of the upright wall 37. The upright wall 37 has a motor drive 41 placed at its top, and a screw rod is integrally connected to the shaft of the motor drive 41, extending downward on the rear side of the upright wall 37 to be threadedly engaged with the tapped hole of the rear projection of the "L"-shaped stage 39. Thus, clockwise or counter clockwise rotation of the shaft of the motor drive 41 will raise or lower the "L"-shaped stage 39 on the upright wall 37.

A jig holder putting in-and-taking out table 36 rides on two parallel rails 42, which are laid on the cantilever-like extension of the "L"-shaped stage 39. As shown, the cantilever-like extension has a drive 36a attached to one corner for driving the table 36 back and forth within a certain limited range in the ±Y-axial direction on the cantilever-like extension of the "L"-shaped stage 39. Also, the table 36 has detecting means 46 for detecting the identification mark 43, which is formed on the top side of the jig holder. In this particular embodiment, the detecting means 46 comprises four photo-generative and photo-receptive semiconductor elements 43. These photo-sensors 43 can be used in making a decision as to whether a jig holder to be taken out is appropriate for use in holding a selected CSP plate to be diced.

In taking out an appropriate jig holder 14a from the rack 15, the "L"-shaped stage 39 is raised or lowered until it has come to a level given the address searched beforehand, and then, the stage 39 is lowered somewhat below the level. Then, the table 36 is moved in the +Y-axial direction to be laid under the jig holder 14a in the rack 15 (see FIG. 5B), and a decision is made as to whether the overlying jig holder is appropriate for holding the selected CSP plate to be diced.

Figure 6:
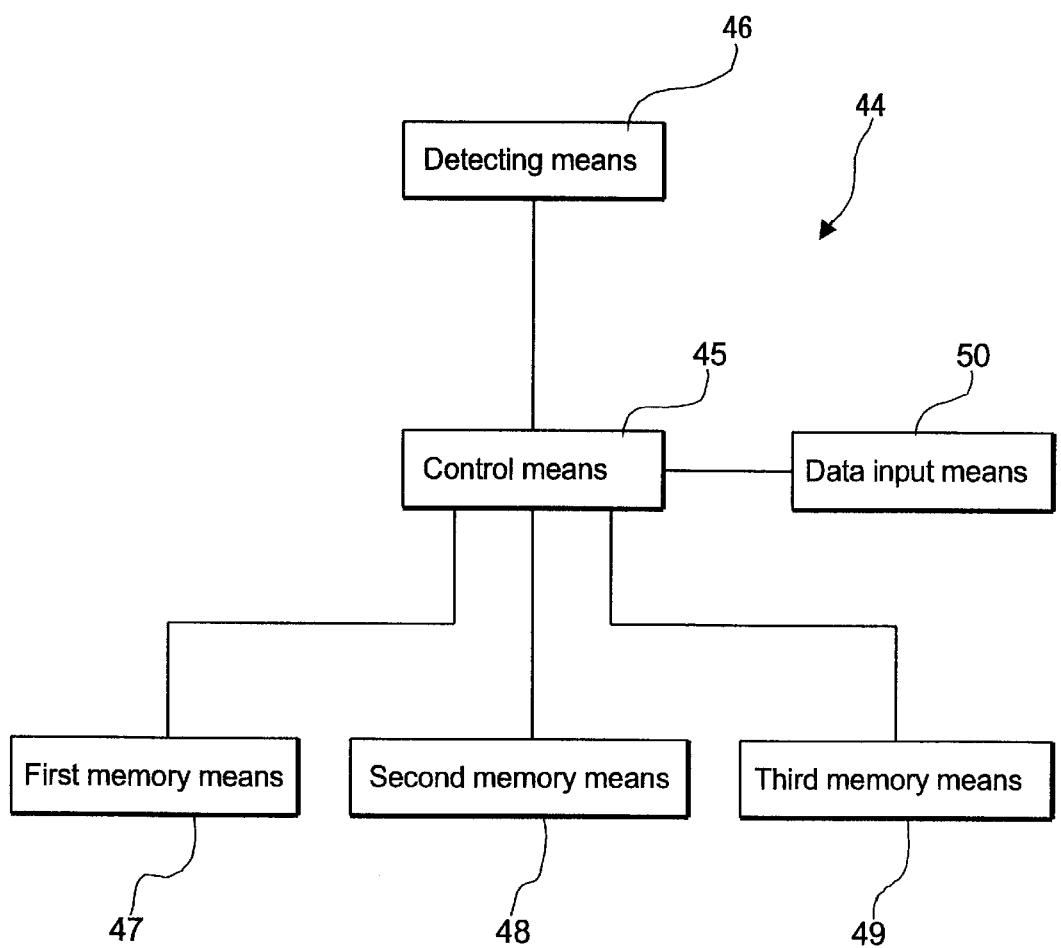
FIG. 6 shows a decision-making system which makes a decision as to whether a particular jig holder selected among a pile of jig holders is appropriate for a selected CSP plate to be diced.

Referring to FIG. 6, the decision-making unit 44 comprises a control means 45 (CPU), a detecting means 46, a data input means 50 (console), and a first, second and third memory means 47, 48 and 49.

The control means 45 permits the storing of selected pieces of information from the data input means 50 in one of these memory means, and the retrieving from the memory means, and the control means makes a required comparison between pieces of information retrieved from different memory means and a required decision on the basis of such comparison.

The detecting means 46 is composed of the photo-sensors 43 in the jig holder putting in-and-taking out table 36 (see FIG. 5) if the identification mark 33 is given in the form of holes, and is composed of a barcode reader if the identification mark 33 is given in the form of barcode.

Specifically, an operator stores the identification number of CSP plates 11 to be diced in the first memory means 47 by using the data input means 50. The identification number is a three-digit number varying with the size and thickness of the plate, the size of pellets and such like. In this particular example, the identification number is 001, and is stored in the first memory means 47, indicating that a selected CSP plate whose identification number is 001 is to be diced, as seen from FIG. 7A.

As seen from FIG. 7B, the second memory means 48 stores identification numbers of different types of CSP plates, identification letters of associated jig holders and the number of identification holes; addresses of jig holders in the rack; pellet sizes and such like, as for instance follows: the identification letter of the type of jig holder to be associated with a CSP plate whose identification number is 002 is B; such type of jig holders are stored at the addresses 2-1, 2-2, 2-3 and 24 in the rack 15; the pellet size of the 002 CSP plate is 5 millimeter square, and the CSP plate can be divided into 6 (longitudinal divisions) times 14 (lateral divisions).

The detecting means 46 detects the identification holes of the jig holder 14a which is about to be taken out by the putting in-and-taking out table 36. The number of the identification holes along with the identification letter are stored in the third memory means 49, as seen from FIG. 7C.

The data inputting means 50 in the form of console 51 is positioned on the front side of the dicing machine 10, and it is used in putting pieces of information in the first and second memory means 47 and 48.

First, the operator inputs in the first memory means 47 the identification number 001 of a selected CSP plate 11 to be diced.

Figure 5A:
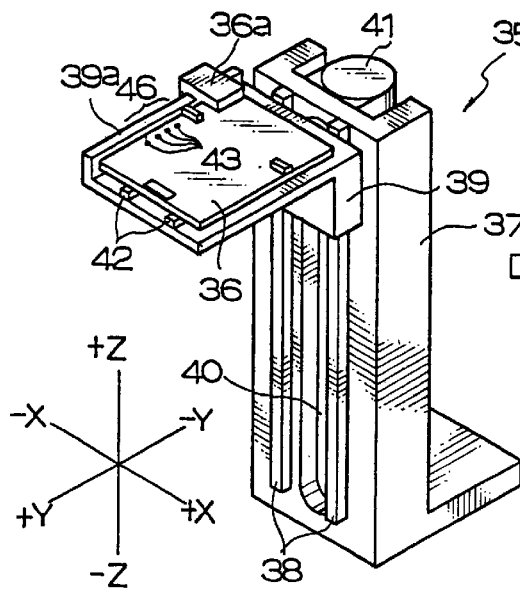
FIG. 5 illustrates how a selected jig holder can be taken out from the jig holder rack with a taking out-and-in carrier.
Figure 5B:
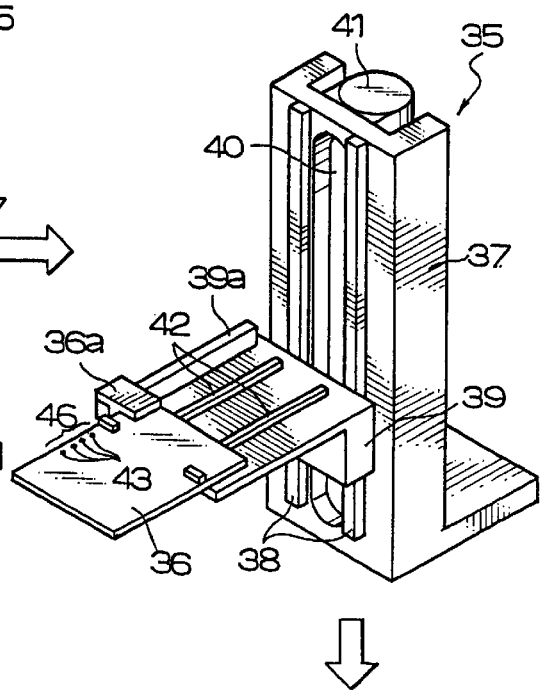
Figure 5D:
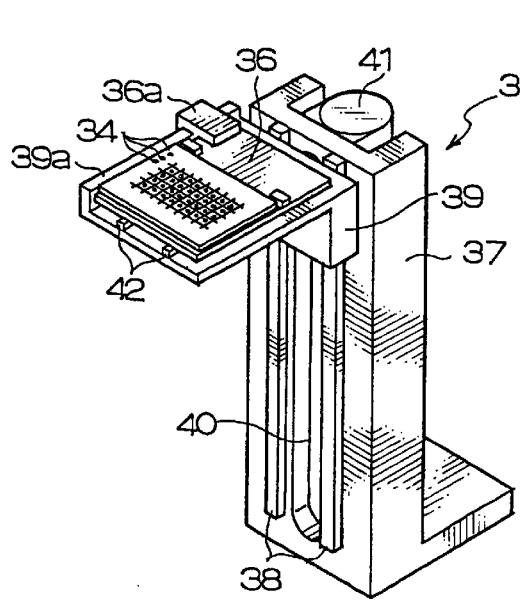

After finding which address in the rack a required jig holder is located by referring to the content of the second memory means, the putting in-and-taking out table 36 is moved to the address thus found, and then the putting in-and-taking out table 36 is made to advance under the jig holder 14a (identification letter A) in the rack 15, as seen from FIG. 5B. The identification holes 34 of the jig holder 14a are detected by the detecting means 46, and the number of the so detected identification holes is stored in the third memory means 49.

Specifically the photo-generative semiconductor elements 43 project beams of light to the holes 34 of the overlying jig holder 14a. The beam of light directed to the hole-less area is reflected from the rear side of the jig holder 14a whereas the other beams of light directed to the holes 34 are not reflected from the jig holder 14a. Thus, the photo-sensors 43 can determine how many holes 34 are made on the jig holder 36 in terms of the reflected beam of light, as for instance follows:

assuming that the jig holder 14a of identification letter A has three holes 34 made therein; the jig holder 14b of identification letter B has two holes 34 made therein; the jig holder 14c of identification letter C has one hole 34 made therein; and the jig holder 14d of identification letter D has no hole 36 made therein; and assuming that the jig holder 14a of identification letter A is above the putting in-and-taking out table 36, three reflected beams of light are of least strength, and one reflected beam of light is of good strength, thus identifying the overlying jig holder 14a as the one of identification letter A. The detection result is stored in the third memory means 49.

The control means 45 makes a decision as to whether the contents of the first and third memories 47 and 49 meet the CSP-to-jig correspondence relationship stored in the second memory means 48. Specifically the identification number of the CSP plate stored in the first memory means 47 is 001 whereas the identification letter of the jig holder stored in the third memory means 49 is A. Then, the CSP-to-jig correspondence relationship stored in the second memory means 48 is satisfied, so that the jig holder 14a lying above the putting in-and-taking out table 36 is determined to be appropriate for holding the CSP plate 001.

Figure 5C:
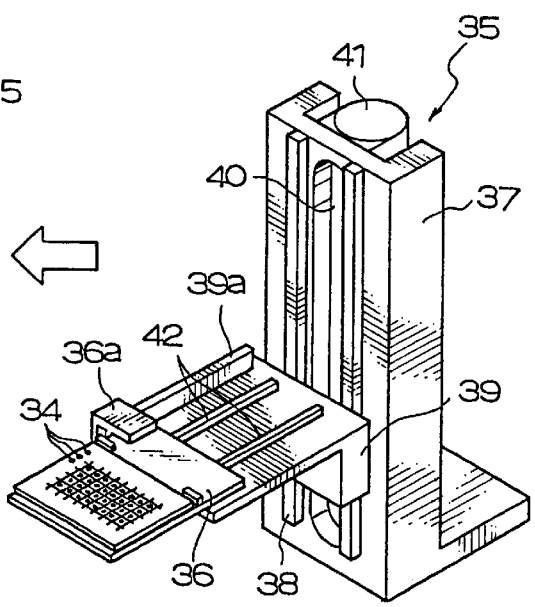

Thus, the putting in-and-taking out table 36 is raised to bear the jig holder 14a, as seen from FIG. 5C. The putting in-and-taking out table 36 is moved in the −Y-axial direction to take out the jig holder 14a from the rack 15, and then, the putting in-and-taking out table 36 is raised up to the highest level (see FIG. 5D), permitting the putting in-and-taking out table 36 to appear on the dicing machine 10.

In case that the contents stored in the first and third memories 47 and 49 fail to satisfy the CSP-to-jig correspondence relationship stored in the second memory means 48, the jig holder 14a lying above the table 36 is determined to be inappropriate for holding the CSP plate 001, and then the fact thus confirmed is given in the display 52 without taking out the jig holder 1a from the rack 15.

Even if a wrong jig holder is stored in the address to which the putting in-and-taking out table 36 has an access, the taking out of the wrong jig holder can be avoided by allowing the decision-making means 44 to confirm that the jig holder does not meet the CSP-to-jig correspondence relationship relative to the selected CSP plate 11.

Thus, the correct jig holder 14a is put on the putting in-and-taking out table 36. On the other hand, a selected CSP plate 11 is taken out from the cassette 12 by moving the CSP plate carrier 53 in the X-axial direction, putting the CSP plate 11 on the tentative storage station 54.

In the tentative storage station 54 the conveyer belt 54a runs in the −X-axial direction, carrying the selected CSP plate 11 to a predetermined position where the CSP plate transporting means 55 transports the CSP plate 11 to the jig holder 14a, which is laid on the putting in-and-taking out table 36.

Figure 8:
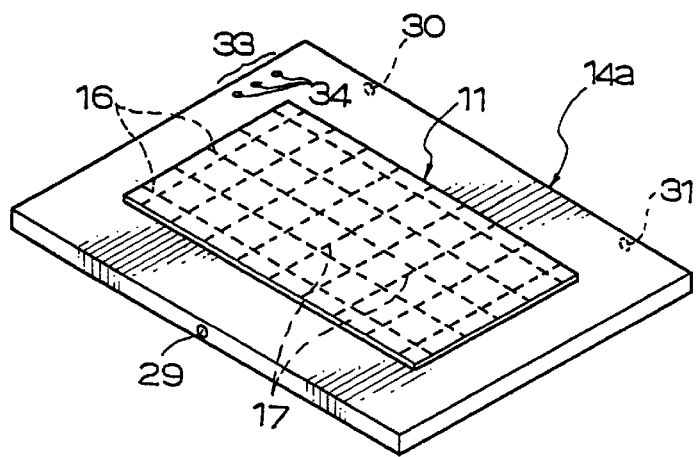
FIG. 8 illustrates how the CSP plate is held on the jig holder.

As shown in FIG. 1, the CSP plate transporting means 55 comprises a third guide rail 56 extending in the Y-axial direction, a drive 57 running on the guide rail 56 and an up-and-down unit 58 fixed to the drive 57. The up-and-down unit 58 has suction means 59. The up-and-down unit 58 is lowered to suck and hold the CSP plate 11 in the tentative storage station, and then, the up-and-down unit 58 is raised and moved in the −Y-axial direction to bring the CSP plate 11 to the jig holder 14aabove. The up-and-down unit 58 is lowered to release the CSP plate 11 onto the jig holder 14a (see FIG. 8).

Thus, the CSP plate 11 is put on the jig holder 14a, which is laid on the putting in-and-taking out table 36, and then, the CSP plate 11 along with the jig holder 14a are transported to the working table 61 by the first transport means 60.

The first transport means 60 is composed of an elongated cantilever-like extension 62 and a gripper 63 movable along the cantilever-like extension 62 in the X-axial direction and vertically in the Z-axial direction. The gripper 63 has three suction pipes 64 for holding the jig holder 14a.

These suction pipes 64 are applied to the engagement holes 29, 30 and 31 of the jig holder 14a as shown in FIG. 2. Negative pressure is applied to the overlying CSP plate 11 via the duct passages 32 and the second suction holes 21 to hold fixedly the CSP plate 11 on the jig holder 14a by suction. Thus, the CSP plate 11 is fixedly gripped and brought by the gripper 63 to the working table 61 above. The gripper 63 is lowered toward the working table 61 while putting the suction pipes 64 apart from the engagement holes 29, 30 and 31, thus allowing the CSP plate-and-jig holder combination to land and stay on the working table 61. Then, negative pressure is applied to the CSP plate 11 via the first suction holes 20, thereby holding fixedly the CSP plate-and-jig holder combination on the working table 61.

Then, the working table 61 is moved in the −X-axial direction to the alignment means 66 below to detect the crosswise cutting lines 16 and 17 on the CSP plate 11, so that the CSP plate 11 may be aligned with the cutting blade 67 in the Y-axial direction.

Movement of the working table 61 in the −X-axial direction permits the cutting blade 67 of the cutter means 68 to cut the CSP plate 11 along a selected longitudinal cutting line 16. Every time the CSP plate has been cut along each longitudinal cutting line 16, the CSP plate 11 is displaced the line-to-line interval distance in the Y-axial direction, and the working table 61 is reciprocated in the X-axial direction. Thus, the CSP plate 11 is cut along each and every longitudinal cutting line 16.

Then, the working table 61 is rotated 90 degrees to permit the sequential cutting along each and every lateral cutting line 17, thus dicing the CSP plate. Minute pieces of debris are apt to be sucked through the first suction holes 20 so that some pellets may be contaminated with minute pieces of debris on their rear sides.

The diced CSP plate-and-jig holder combination is transported to the cleaning table 70 by the second transport means 69. The second transport means 69 is composed of a movable arm 71 having an up-and-down grip 72 attached to its tip end. The movable arm 71 can be moved both in the X- and Y-axial directions, and the up-and-down grip 72 can be raised and lowered. The up-and-down grip 72 has three suction pipes 73 to be applied to the engagement holes 29, 30 and 31 of the jig holder 14a.

The washing table 70 is substantially same as the working table in structure. It is a turn table having suction holes. When a CSP plate-and-jig holder combination is put on the washing table, it is rotated and exposed to the jet of washing water to remove minute pieces of debris from the upper surface of the diced CSP plate 11. Finally it is dried by blowing air. Pieces of debris drawn from the first suction holes 20 into the space between the jig holder 14a and the overlying diced CSP plate, however, cannot be washed away.

After being washed and dried, the diced CSP plate-and-jig holder combination is transported to the CSP plate table 75 by the third transport means 74. The third transport means 74 is composed of a bridge-like extension 76 extending in the X-axial direction, an arm 77 movable along the bridge-like extension 76 in the X-axial direction and vertically in the Z-axial direction, and a gripper 78 attached to the end of the arm 77. As is the case with the first and second transport means 60 and 69, the gripper 78 has three suction pipes 79 to engage with the engagement holes 29, 30 and 31 of the jig holder 14a for sucking and holding a diced CSP plate-and-jig holder combination.

When the diced CSP plate-and-jig holder combination is transported to the CSP plate bearing table 75 above by the gripper 78, the gripper 78 is lowered while the suction pipes 79 are put away from the engagement holes 29, 30 and 31, thus landing and leaving the diced CSP plate-and-jig holder combination on the CSP plate bearing table 75.

The CSP plate bearing table 75 can be moved in the Y-axial direction, and can be rotated, also. The CSP plate bearing table 75 is moved in the Y-axial direction to put the diced CSP plate-and-jig holder combination in position appropriate for picking up pellets one by one.

Transport trays are stored in the transport tray storage area 80 ahead of the CSP plate turning table 75 in the +X-axial direction. The pick up-and-transport means 81 extends from the CSP plate bearing table 75 to the transport tray storage area 80 above.

The pick-up-and-transport means 81 comprises two movable pellet-suction means 83 each movable both in the X-axial and Z-axial directions, each carrying a selected pellet and an elongated guide 82 which guides each movable pellet-suction means in the X-axial direction while it travels on the way from the CSP plate bearing table 75 to the transport tray station 80.

Figure 9:
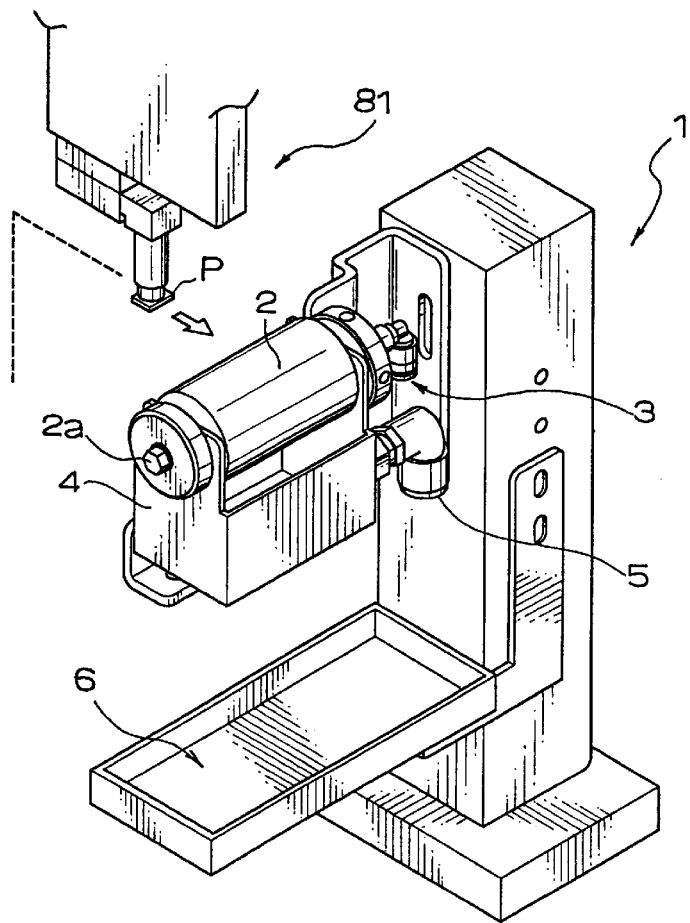
FIG. 9 is a perspective view of one example of pellet cleaning means.

Under the passage for each pellet-suction means 83 to follow, there is cleaning means 1 for wiping and removing minute debris, if any from the rear side of each pellet on the way from the CSP table bearing table 75 to the transport tray station 80. Referring to FIG. 9, the cleaning means 1 comprises a wiper 2 for removing minute debris from the rear side of each pellet, washing liquid supply means 3 for supplying the wiper 2 with the washing liquid, a sink 4 for receiving used washing liquid, a drain 5 connected to the sink 4 for draining used washing liquid, and a tray 6 for receiving used washing liquid falling from the drain 5.

Figure 10:
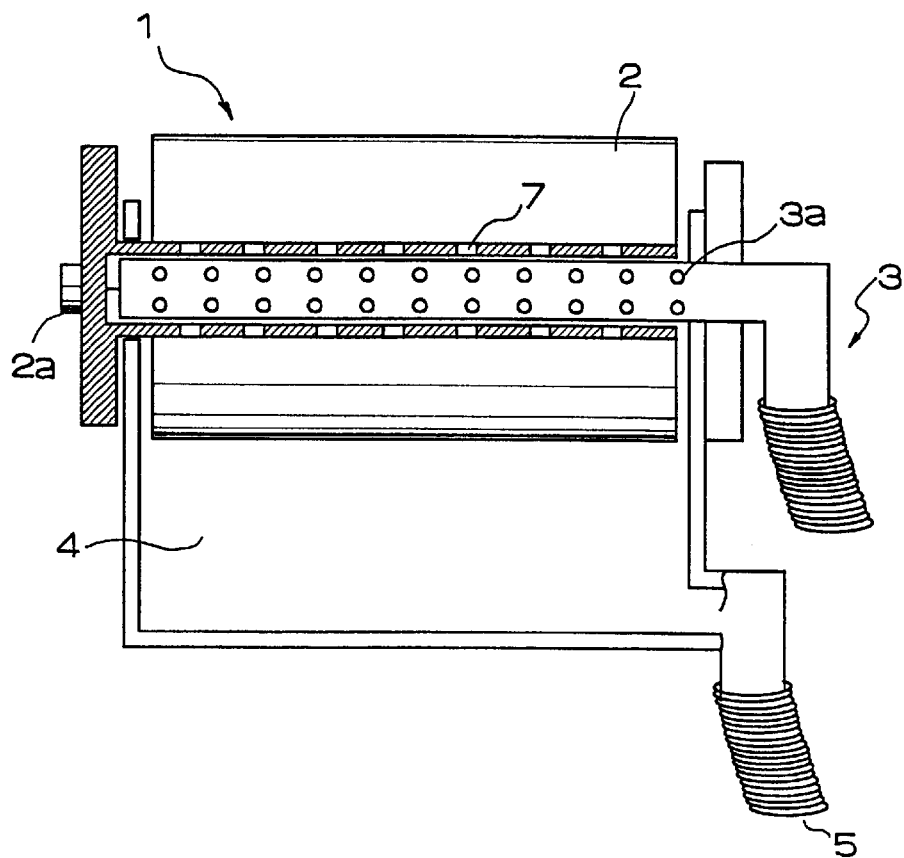
FIG. 10 is a longitudinal section of the pellet cleaning means, showing its inner structure.

The wiper 2 comprises a rotary sponge roll, which can rotate about its center axis 2a. As shown in FIG. 10, the rotary sponge roll has washing liquid supply means 3 fitted in the center of the sponge roll. Specifically the washing liquid supply means 3 comprises a stationary center pipe having a plurality of nozzle apertures 7 made therein and a conduit having a plurality of apertures 3a made therein. The conduit is loosely fitted in the stationary center pipe, permitting the washing liquid to infiltrate into the sponge roll. The wiper 2 may be so designed as to rotate with hand. Preferably the wiper 2 is rotated by an associated motor.

The first transport tray bearing table 85 bears an empty transport tray 86. The table 85 can be raised and lowered in the Z-axial direction, and can be moved in the Y-axial direction to crawl under the first transport tray rack 87, in which a plurality of empty transport trays 86 are laid on each other to form a stack, and the lowermost transport tray is taken out by the table 85. Then, the table 85 bearing an empty transport tray 86 returns to the transport tray storage area 80.

To pick up and transfer each pellet from the diced CSP plate to a transport tray 86 the CSP plate bearing table 75 is moved in the Y-axial direction until the diced CSP plate-and-jig holder combination has been put in position in which a selected pellet is put below either gripper 83. Then, the gripper 83 is lowered to suck the selected pellet, and the gripper 83 is raised.

On the other hand, the transport tray 86 advances in the Y-axial direction in unison with the stepwise-movement of the first transport tray bearing table 85 in the Y-axial direction, so that the transport tray 86 may be aligned with the gripper 83 in the X-axial direction. Then, the gripper 83 gripping the selected pellet is moved in the +X-axial direction.

Figure 11:
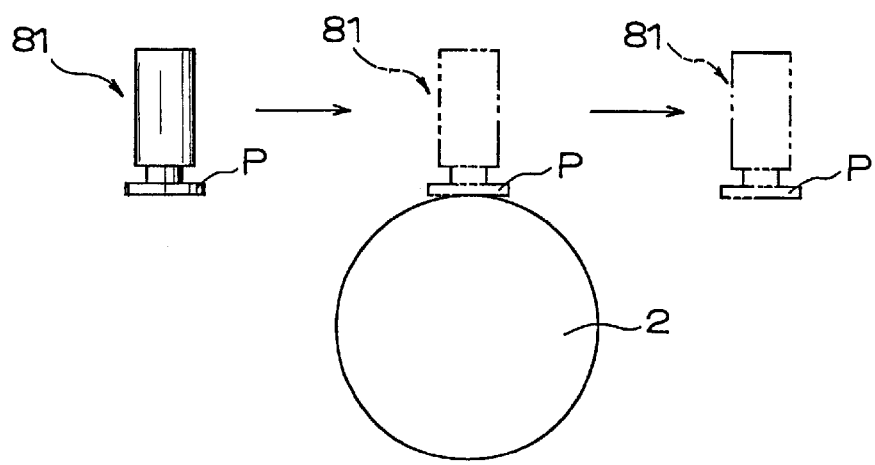
FIG. 11 illustrates how the rear side of the pellet is cleaned with the pellet cleaning means.

The pellet cleaning means 1 is placed on the way for the gripper 83 to follow from the diced CSP plate bearing table 75 to the transport tray storage area 80. As seen from FIG. 11, the pellet P sucked by the gripper 83 is made to override the wiper 2, thereby permitting the wiper 2 to remove minute pieces of debris from the rear side of the pellet P.

Each and every pellet can be cleaned before being put in the transport tray, thus eliminating the possibility of contaminating other parts with minute pieces of debris when the pellets are put in the assembling line in the factory.

The required cleaning is effected on the way to the transport tray storage area 80, requiring no extra time for cleaning. Thus, the quality of pellets can be improved without lowering the productivity. When the wiper 2 is supplied with washing liquid, the wiper 2 thus wet with the washing liquid has an increased cleaning capability.

The wiper 2 is rotated little by little so that it may expose clean surface to every pellet all the time. Also, the wiper 2 is moved step by step in the Y-axial direction so that the whole surface of the wiper may be used for cleaning.

After cleaning the rear side of the pellet P the gripper 83 continues moving to the transport tray 86, and it stops above a selected cell in the transport tray. Then, the gripper 83 is lowered to release the pellet to the selected cell.

The proceeding above described is repeated until all cells of the transport tray have been occupied by the cleaned pellets. In this particular embodiment two grippers 83 work in parallel efficiently.

After picking up all pellets the jig holder 14a is left on the CSP plate bearing table 75, and then, the table 75 is made to turn 90 degrees, moving to the jig holder storage area 88 in the +Y-axial direction. The fourth transport means 89 carries the jig holder 14a to the putting in-and-taking out table 36. Then, another CSP plate is put on the jig holder 14a to resume the dicing and transporting work.

When all CSP plates are diced and transported, the jig holder 14a is returned to the jig holder rack 15 to be pigeonholed at its original address.

Advantageously the jig holder 14a can be repeatedly used. In practice, four jig holders can be used simultaneously by moving them in unison.

The transport tray 90 thus filled with pellets is transferred to the second transport bearing able 92 by the transport means 91. As shown in FIG. 1, the transport means 91 comprises a guide rail 91 a, a transverse arm 93 movable along the guide rail 91a in the X-axial direction, and a pinch unit 94 fixed to the end of the transverse arm 93. The pinch unit 94 is lowered to hold the pellet-filled transport tray 90, and the pinch unit 94 is raised and moved in the +X-axial direction to carry the transport tray 90 to the second transport tray bearing table 92 above. The pinch unit 94 is lowered to release the transport tray 90 to the second tray bearing table 92.

The second tray bearing table 92 can be moved both in the Y- and Z-axial directions inside the dicing machine. The table 92 is moved to the second transport tray rack 95 below, inserting the new pellet-filled transport tray into the bottom of a stack of pellet-filled transport trays in the second transport tray rack 95.

As may be understood from the above, the dicing and transporting machine permits the dicing of each CSP plate, cleaning of the rear side of each pellet and loading of transport trays with uncontaminated pellets. Thus, the series of works can be performed at an increased efficiency, and such machine is advantageous from the economical and productivity point of view.

The cleaning means according to the present invention is described above as being applied to the dicing of CSP plates each fixedly held by an associated jig holder, but it can be equally applied to the dicing of CSP plates each fixedly held by an associated frame with adhesive tape.

What is claimed is:

1. A dicing machine for cutting a CSP plate into pellets to put them in a transport tray including a CSP plate bearing table on which a diced CSP plate is to be laid, a transport tray station in which a transport tray is laid to receive individual pellets, and a pick-up-and-transport means for picking a selected pellet from a diced CSP plate and for putting the so selected pellet in an allotted cell in the transport tray, wherein it further includes cleaning means for wiping and removing minute pieces of debris from the rear side of each pellet on the way from the CSP plate bearing table to a transport tray storage area.

2. A dicing machine according to claim 1, wherein the pick-up-and-transport means comprises movable pellet-suction means for carrying a selected pellet and an elongated guide for guiding the movable pellet-suction means while it travels on the way from the CSP plate bearing table to the transport tray storage area, thereby allowing the cleaning the cleaning means to wipe and remove minute pieces of debris from the rear side of each pellet.

3. A dicing machine according to claim 1, wherein the cleaning means comprises a wiper for removing minute pieces of debris from the rear side of each pellet, washing liquid supply means for supplying the wiper with washing liquid, and a drain for draining used washing liquid.

4. A dicing machine according to claim 3, wherein the wiper comprises a rotary sponge roll, which has the washing liquid supply means fitted in the center of the sponge roll.

5. A dicing machine for cutting a CSP plate into a plurality of individual pellets and placing individual ones of the pellets into a transport tray, the dicing machine comprising:
cutting means for cutting the CSP plate into the plurality of individual pellets, each individual pellet having a top surface and a rear surface disposed opposite to the top surface;
pick-up-and-transport means for picking-up the individual ones of the pellets on the top surface and transporting the picked-up individual ones of the pellets to the transport tray positioned at a transport station; and
cleaning means for cleaning the rear surface of each picked-up individual pellet as the each picked-up individual pellet is being transported from the cutting means to the transport station.

6. A dicing machine according to claim 5, wherein the cleaning means includes a sponge roll with a washing liquid absorbed therein that extends along a rolling axis, the sponge roll operative to roll about the rolling axis and to make tangential contact with the rear surface of each picked-up individual pellet while the sponge roll rolls about the rolling axis and the each picked-up individual pellet is being transported from the cutting means to the transport station.

7. A dicing machine according to claim 5, wherein the cleaning means is disposed between the cutting means and the transport station.

* * * * *